United States Patent [19]
Roche

[11] Patent Number: 4,694,777
[45] Date of Patent: Sep. 22, 1987

[54] APPARATUS FOR, AND METHODS OF, DEPOSITING A SUBSTANCE ON A SUBSTRATE

[76] Inventor: Gregory A. Roche, 4287 Drybed Ct., Santa Clara, Calif. 95054

[21] Appl. No.: 751,682

[22] Filed: Jul. 3, 1985

[51] Int. Cl.[4] .......................... B05D 3/06; C23C 14/00
[52] U.S. Cl. .................................. 118/725; 118/729; 118/730; 118/50.1; 427/54.1
[58] Field of Search ............... 118/725, 728, 729, 730, 118/50.1, 620, 621; 427/53.1, 54.1, 55

[56] References Cited

U.S. PATENT DOCUMENTS

| | | |
|---|---|---|
| 3,271,180 | 9/1966 | White . |
| 3,364,087 | 1/1968 | Solomon et al. . |
| 3,661,637 | 5/1972 | Sirtl ........................................ 427/55 |
| 3,761,677 | 9/1973 | Mitzutani . |
| 4,059,461 | 11/1977 | Fan et al. . |
| 4,260,649 | 4/1981 | Denison et al. .................... 427/53.1 |
| 4,340,617 | 7/1982 | Deutsch et al. .................... 427/53.1 |
| 4,343,827 | 8/1982 | Tochikubo et al. . |
| 4,363,828 | 12/1982 | Brodsky et al. ...................... 427/86 |
| 4,371,587 | 2/1983 | Peters ................................... 428/446 |
| 4,421,479 | 12/1983 | Muka et al. .......................... 432/31 |
| 4,435,445 | 3/1984 | Allred et al. ....................... 427/54.1 |

FOREIGN PATENT DOCUMENTS

| | | |
|---|---|---|
| 141417 | 5/1985 | European Pat. Off. . |
| 154561 | 9/1985 | European Pat. Off. . |
| 221475 | 4/1985 | Fed. Rep. of Germany . |
| 60-194425 | 11/1984 | Japan . |

*Primary Examiner*—John H. Newsome
*Attorney, Agent, or Firm*—Ellsworth R. Roston; Charles H. Schwartz; Thomas R. Fitzgerald

[57] ABSTRACT

A beam of substantially coherent light passes through a window in an enclosure in a direction substantially parallel, but contiguous, to a substrate in the enclosure to produce a deposition of a substance on the substrate. The beam may have a width corresponding substantially to the width of the substrate or it may be relatively narrow and swept across the substrate. The beam is relatively narrow in a direction substantially perpendicular to the substrate. Differences in the beam strength at individual positions along the substrate may be compensated by reflecting the beam, after passing the substrate, to travel in a reverse direction along the substrate or by directing the beam slightly downwardly along the substrate during movement along the substrate. A second substrate may be substantially parallel to, but slightly spaced from, the first substrate, so that the light beam passes between the substrates to obtain a deposition of the substance on both substrates. The substrate(s) may be moved relative to the beam either along the beam, transverse to the beam or in a rotary direction or in a combination of such directions. Gases reactive at high energies to form the substance are introduced into the enclosure to form the substance when energized by the light beam. The gases may be introduced into the enclosure at a first side of the substrate(s) in contiguous relationship to the substrate(s) for passage along the substrate(s). The gases may be exhausted from the enclosure is contiguous relationship to the substrate(s) at a second end of the substrate(s) opposite the first end. Neutral gases such as nitrogen may be directed past the window for preventing the substance from being deposited on the window and may be leaked into the enclosure for mixture with the gases in the enclosure.

38 Claims, 15 Drawing Figures

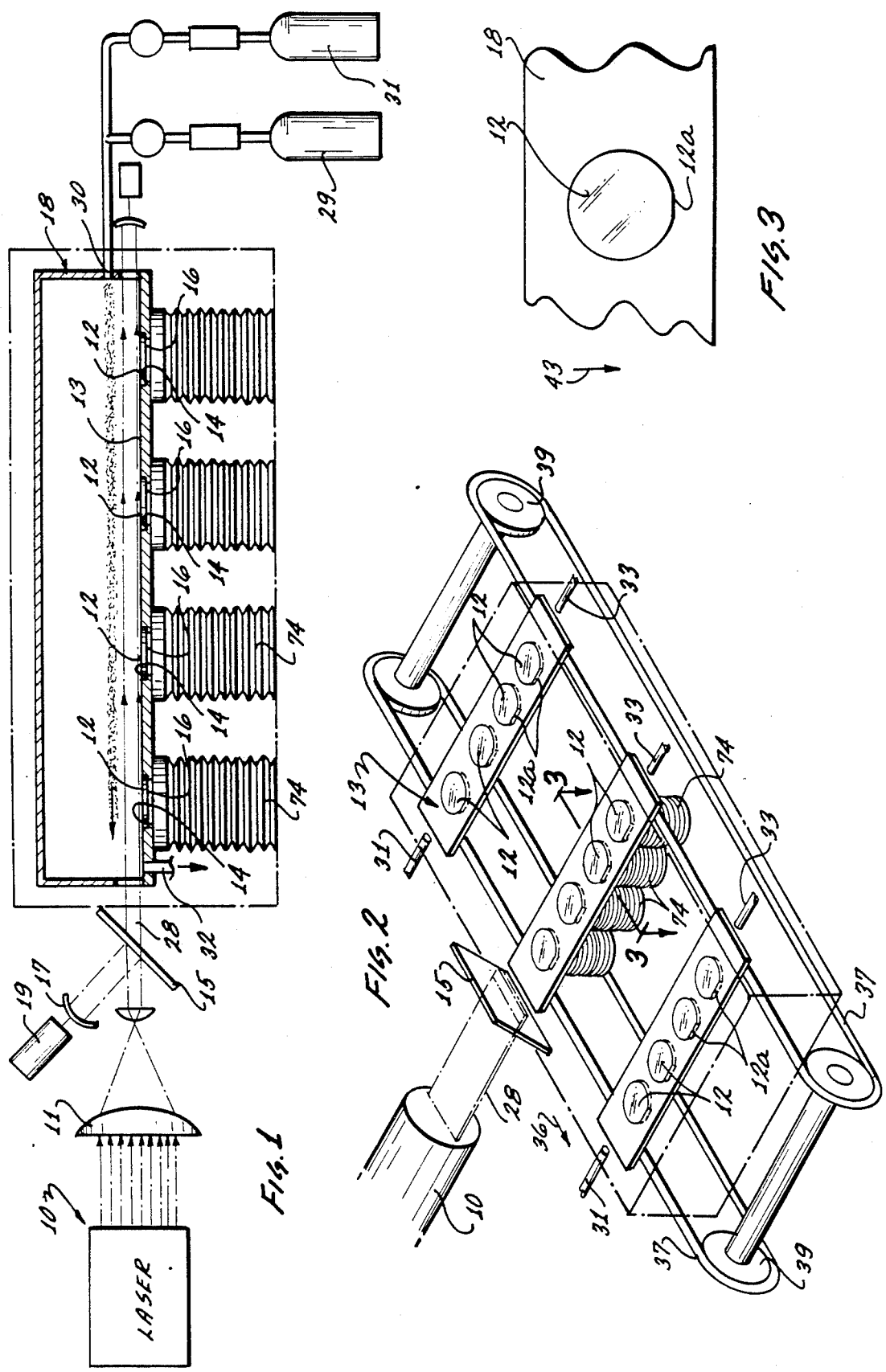

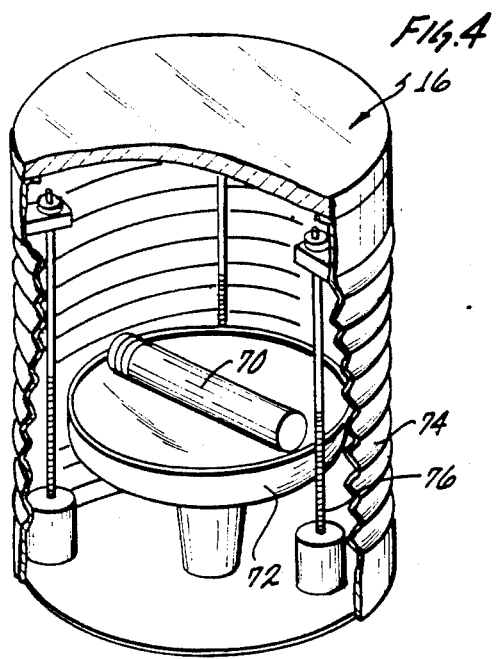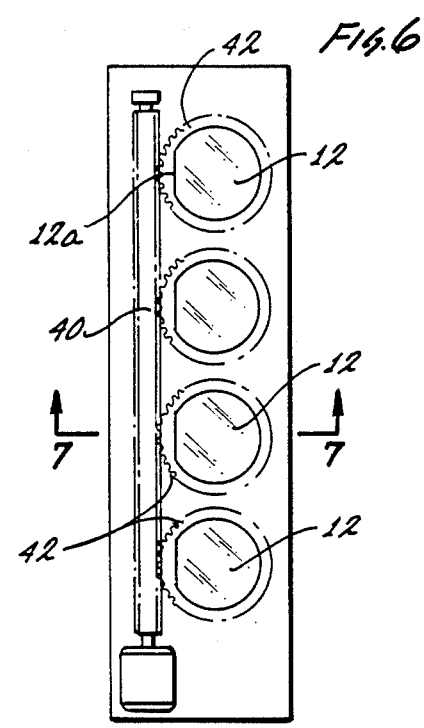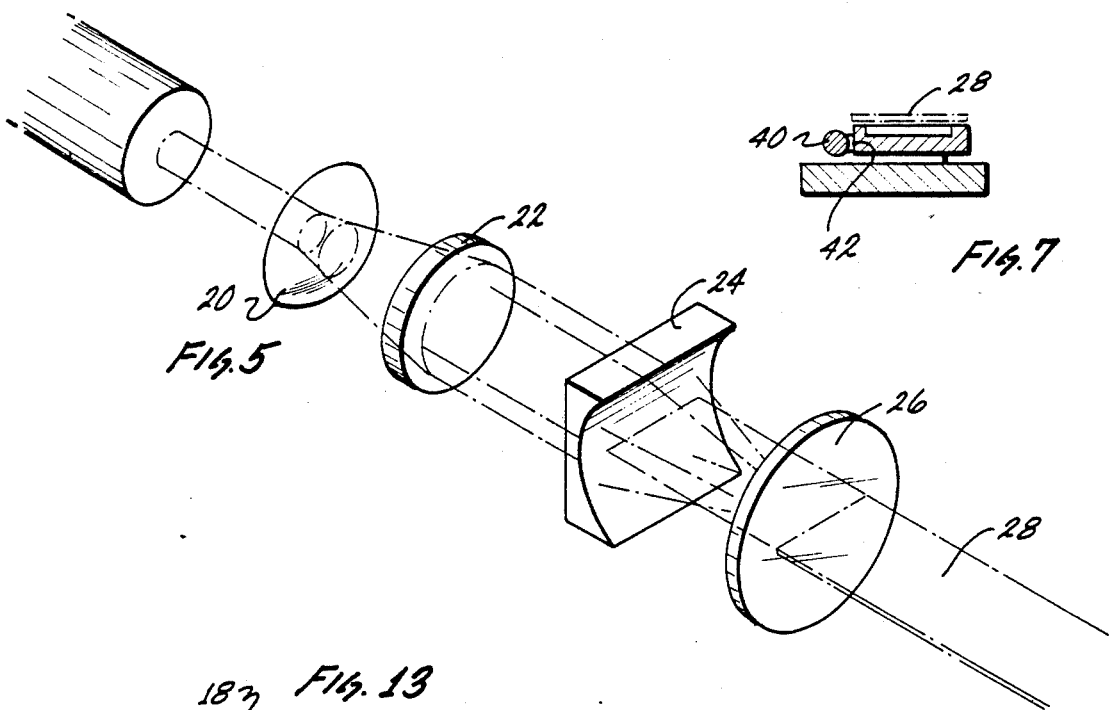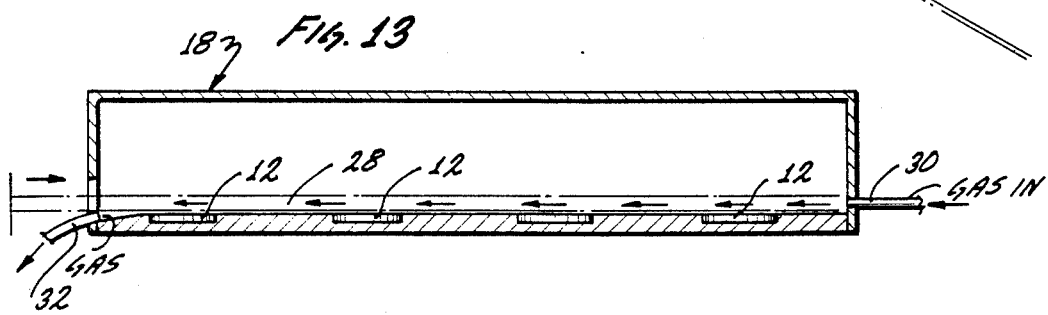

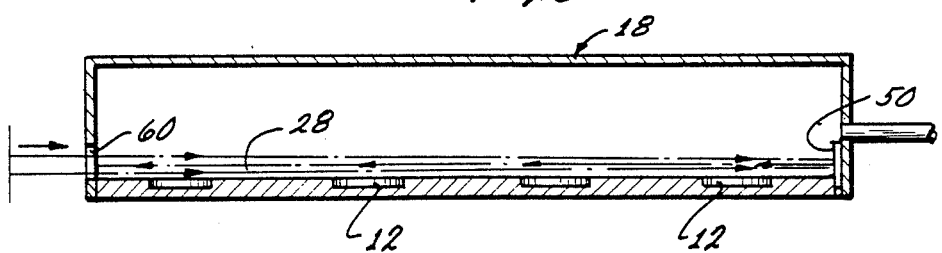
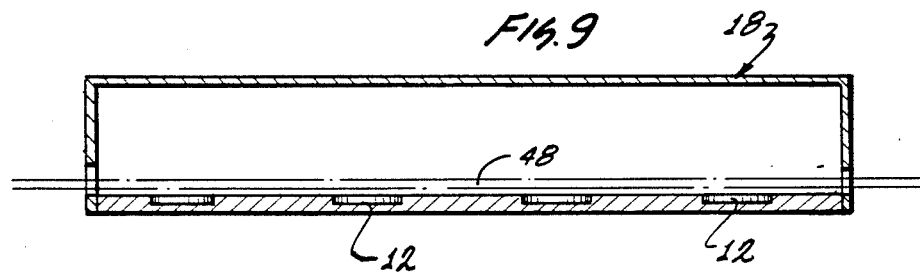
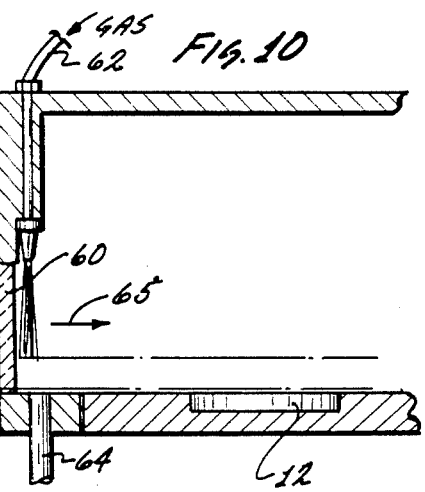
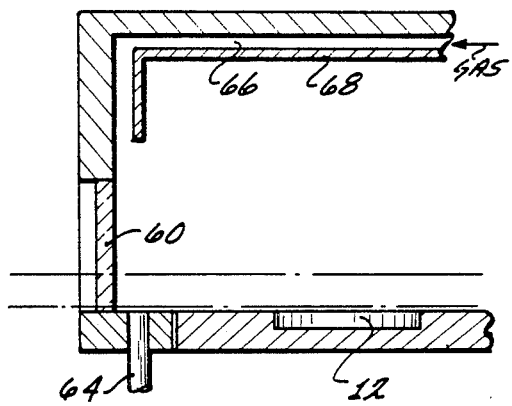
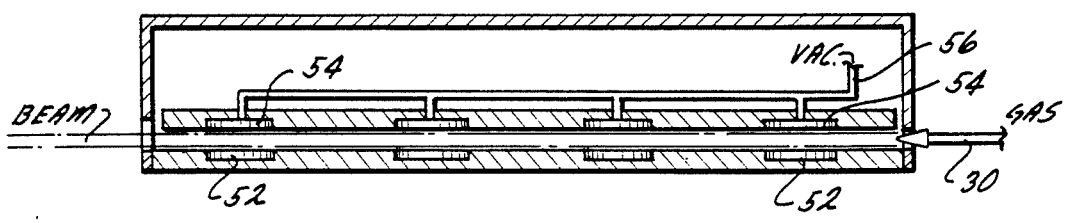

APPARATUS FOR, AND METHODS OF, DEPOSITING A SUBSTANCE ON A SUBSTRATE

This invention relates to apparatus for, and methods of, producing a substantially uniform, pure and stable deposition of a substance at relatively low temperatures on a substrate. The invention particularly relates to apparatus for, and methods of, directing a beam of substantially coherent light to a substrate to obtain a deposition of a substantially uniform, pure and stable deposition of a substance on the substrate.

Various types of apparatus and methods have been developed, and are presently in use, for depositing a substance such as a silicon dioxide on a substrate such as a silicon wafer. Such apparatus and methods are disadvantageous in several respects. They require high temperatures in an enclosure holding the substance to obtain the formation of the substance and the deposition of the substance on the substrate. Such high temperatures are undesirable because they produce warpage of the substrate and increase the tendency for the substance to become deposited in the enclosure at other places than on the substrate. Such high temperatures are also undesirable because they increase the difficulty of obtaining a substantially uniform, pure and stable deposition of the substance on the substrate.

In recognition of the disadvantages discussed in the previous paragraph, apparatus and methods have been developed, and are in use, for depositing a substance on a substrate by techniques of chemical vapor deposition. Some of such apparatus and methods even provide for a deposition of the substance on the substrate at low temperatures. Such apparatus and methods are disadvantageous because they do not produce a substantially uniform, pure and stable deposition of the substance on the substrate.

In co-pending application Ser. No. 587,284 filed by me on Mar. 7, 1984 for "Apparatus and Method for Laser-Induced Chemical Vapor Deposition", apparatus and methods are disclosed and claimed for producing a substantially uniform, pure and stable deposition of a substance on a substrate at low temperatures. In the apparatus and methods disclosed and 11 claimed in application Ser. No. 587,284, a beam of substantially coherent light is directed along a substrate in substantially parallel, and contiguous, relationship to the substrate to obtain the formation of the substance from the gases and the deposition of the substance on the substrate. Heat is directed on a localized basis to the substrate in a direction substantially perpendicular to the substrate to facilitate the deposition of the substance on the substrate. The substrate can be adjusted in position relative to the lingt beam to optimize the deposition of the substance on the substrate.

This invention provides a number of improvements in the apparatus and methods disclosed and claimed in application Ser. No. 587,284. Such improvements are designed to enhance the uniformity, purity and stability of the substance deposited on the substrate. Such improvements are further designed to enhance the efficiency in the operation of such apparatus and in such methods from a number of different standpoints including (a) the amount of gases used to deposit the substance on the substrate, (b) the time required to deposit the substance on the substrate, (c) the number of substrates capable of being deposited at any one time and (d) the uniformity, stability and purity of the substance deposited on the substrate.

In one embodiment of the invention, a beam of substantially coherent light passes through a window in an enclosure in a direction substantially parallel, but contiguous, to a substrate in the enclosure to produce a deposition of a substance on the substrate. The beam may have a width corresponding substantially to the width of the substrate or it may be relatively narrow and swept across the substrate. The beam is relatively narrow in a direction substantially perpendicular to the substrate.

The beam strength at different positions along the substrate may be compensated by reflecting the beam, after passing the substrate(s), to travel in a reverse direction along the substrate(s) or by directing the beam slightly downwardly along the substrate(s) with progressive positions along the substrate(s). A second substrate may be disposed in substantially parallel, but slightly spaced, relationship to the first substrate, so that the light beam passes between the substrates to obtain a deposition of the substance on both substrates. The substrate(s) may be moved relative to the beam either along the beam, transverse to the beam in a rotary direction or in a combination of such directions.

Gases reactive at high energy levels to form the substance are introduced into the enclosure to form the substance when energized by the light beam. The gases may be introduced into the enclosure at a first side of the substrate(s) in contiguous relationship to the substrate(s) for passage along the substrate(s). The gases may be exhausted from the enclosure in contiguous relationship to the substrate(s) at a second end of the substrate(s) opposite the first end. Neutral gases such as nitrogen may be directed past the window for preventing the substance from being deposited on the window and may be leaked into the enclosure for mixture with the gases in the enclosure.

In the drawings:

FIG. 1 is a schematic elevational view of apparatus constituting one embodiment of the invention for obtaining a deposition of a substance on substrates in an enclosure;

FIG. 2 is a perspective view of the apparatus shown in FIG. 1 as seen from a position above and to one side of the apparatus;

FIG. 3 is an enlarged fragmentary sectional view and is taken substantially on the line 3—3 of FIG. 2;

FIG. 4 is an enlarged fragmentary perspective view of certain of the members shown in FIG. 2 and is partially broken away to show certain internal features in such members in some detail;

FIG. 5 is an enlarged view showing a series of lenses for shaping a light beam provided in an embodiment of the invention.

FIG. 6 is a somewhat schematic top plan view of members which may be included in the embodiments shown in the previous Figures to provide a movement of the substrates in the direction of the light beam.

FIG. 7 is a sectional view of the members shown in FIG. 6 and is taken substantially on the line 7—7 of FIG. 6;

FIG. 8 is a somewhat schematic elevational view of apparatus which may be included in the apparatus shown in the previous Figures for compensating for differences in the strength of the light beam as the light beam moves past progressive substrates in an enclosure;

FIG. 9 is a somewhat schematic elevational view of an alternate embodiment of apparatus for compensating for differences in the strength of the light beam as the light beam moves past progressive substrates in an enclosure;

FIG. 10 is an enlarged fragmentary, somewhat schematic, elevational view of apparatus for preventing a deposition of substances on a window through which light is directed into the enclosure for obtaining the deposition of the substance on the substrates;

FIG. 11 is an enlarged fragmentary, somewhat schematic, elevational view of an alternate apparatus for preventing a deposition of gases on a window through which light is directed into the enclosure for obtaining the deposition of the substance on the substrates;

FIG. 12 is an elevational view of apparatus for increasing the number of substrates on which the substance can be simultaneously deposited;

FIG. 13 is an elevational view of apparatus which may be included in the embodiments shown in the previous Figures for enhancing the efficiency of producing the substance from donor gases and of obtaining a deposit of the substance on the substrate.

Figure 14:
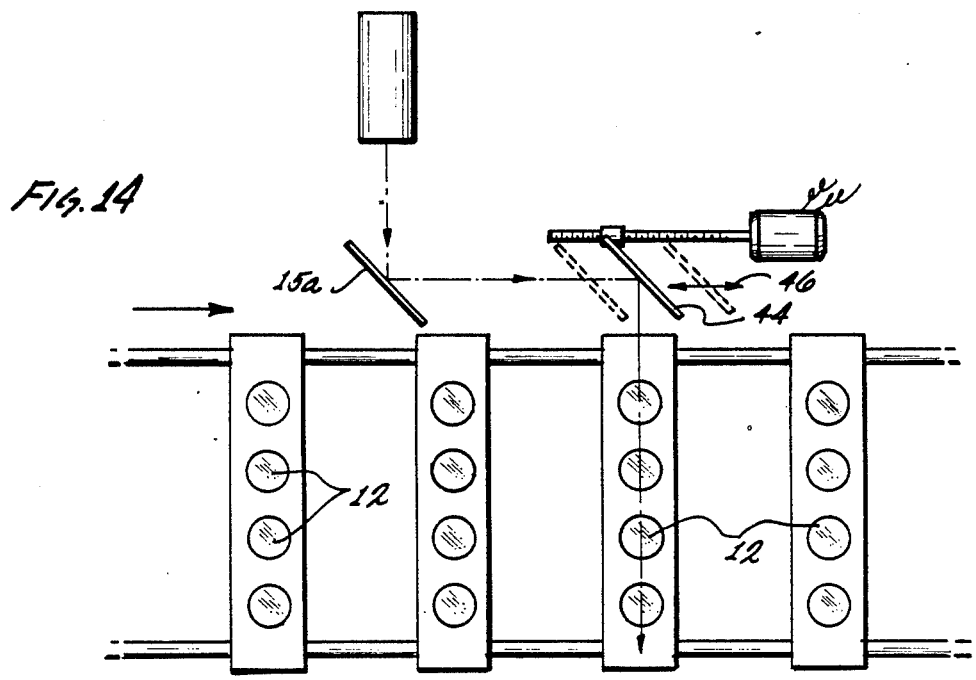
FIG. 14 is a fragmentary schematic view showing an alternative arrangement for obtaining the deposition of the substance at progressive positions on the substrates.

In one embodiment of the invention, a member generally indicated at 10 is provided for producing a beam of substantially coherent light, preferably in the ultraviolet range. The term "beam of substantially coherent light" is used advisedly since it may not be advantageous to have the light completely coherent. One reason is that completely coherent light may establish standing waves along the substrate and these travelling waves may inhibit a uniform deposition of the substance on the substrate.

The member 10 may be a commercially available laser such as a Lumonics 850T Excimer Laser. The laser beam may be pulsed at a suitable repetition rate such as one hundred hertz (100 hz) and may be operated on the 193 nm ArF line. The laser beam may be directed through a mirror 11 toward substrates 12 such as integrated circuit wafers. Each of the substrates 12 may be provided with a flat periphery 12a (FIG. 3) to facilitate a precise positioning of the substrate on a stepped shoulder 14 of a support plate 13. Each of the substrates 12 may be supported on a stepped shoulder 14 which defines the periphery of a window 16 in an enclosure 18. The light from the laser 10 may be directed to a beam splitter 15 which transmits most of the light incident upon it and reflects a selected portion, which may be ten percent (10%) to fifteen percent (15%), to a photodetecter 17. The output of the photodetector 17 is proportional to the power of the beam from the laser 10 and is introduced to a power meter 19 for monitoring the power output from the laser 10.

The beam of substantially coherent light is preferably shaped before it is directed to the substrate 12. This shaping is preferably accomplished by lenses 20, 22, 24 and 26 (FIG. 5) to produce a light beam 28 which is substantially parallel, and contiguous, to the substrates 12 and which is as wide as the lateral dimension of each of the substrates 12 and which is relatively narrow in a direction substantially perpendicular to each of the substrates.

To shape the beam in the lateral direction, the lens 20 maybe provided with a suitable configuration, such as a convex configuration, to widen the beam in the lateral dimension and the lens 22 is preferably provided with a configuration to convert the rays in the beam to a substantially parallel configuration in the lateral dimension. Conversely, the lens 24 is preferably provided with a configuration, such as a concave configuration, to narrow the beam in the dimension of beam height and the lens 26 is preferably provided with a configuration to convert the rays in the beam to a substantially parallel configuration in the dimension of height. As will be appreciated, the beam can be narrowed in the direction of beam height without shaping the beam in the lateral direction.

Preferably the stepped shoulder 14 (FIG. 1) is provided with a height corresponding substantially to the thickness of the substrate 12 so that the surface to be coated on the substrate 12 is substantially flush with the surface of the plate 13. In this way, the gases moving past the substrate 12 have a substantially uniform flow rather than being subjected to turbulence such as tends to occur when the surface to be coated on the substrate 12 is not substantially flush with the surface of the plate.

A nozzle 30 (FIGS. 1 and 13) is disposed in the enclosure 18 preferably in contiguous relationship to the substrate 12 at one end of the enclosure. Preferably the nozzle 30 is disposed (FIG. 13) at the far end of the enclosure 18 in the direction of passage of the light beam 28 through the enclosure. Alternatively, the nozzle 30 may be disposed at the near end of the enclosure in the direction of movement of the light beam 28. Furthermore, the nozzle 30 is preferably disposed at substantially the same vertical level as the top surfaces of the substrates 12 in the enclosure 18 and is adapted to introduce the gases under pressure into a direction substantially parallel to the substrates.

The nozzle 30 is adapted to introduce a mixture of gases which react to form the substance when energized at a relatively high energy level such as by the light beam 28. For example, when the substance is silicon dioxide, the gases may be a silicon donor such as silane ($SiH_4$) in nitrogen and an oxygen donor such as nitrous oxide ($N_2O$). The gas such as silane in nitrogen may be obtained from a source 29 (FIG. 1) and the gas such as nitrous oxide may be obtained from a source 31.

An orifice 32 is also disposed in the enclosure 18 (FIG. 13), preferably in contiguous relationship to the substrates 12 at a second end of the enclosure 18 opposite the nozzle 30. The orifice 32 is preferably disposed at substantially the same vertical level as the top surfaces of the substrates 12 in the enclosure 18. By providing the nozzle 30 and the orifice 32 at opposite ends of the enclosure 18 and in contiguous relationship to the substrates 12, an efficient flow of gas is obtained along the substrates for energizing by the light beam 28. Such an arrangement of the nozzle 30 and the orifice 32 is also advantageous in that the gas flows tend to be localized such that the substance formed from the donor gases tends to be deposited substantially only on the substrates 12. This minimizes any tendency for the substance to be deposited on other members. As will be appreciated, the deposition of the substance on such other members may interfere with the efficient operation of the apparatus constituting this invention.

Although the nozzles 30 and 32 in FIG. 1 are displaced from each other in the direction of the light beam 28, it will be appreciated that nozzles may be disposed in a direction transverse to that shown in FIG. 1. For example, inlet nozzles 31 (FIG. 2) may be disposed at one lateral end of the enclosure 18 and outlet nozzles 33 (FIG. 2) may be disposed at the opposite lateral end of the enclosure.

When the beam 28 of substantially coherent light is directed through the enclosure 18 toward the substrates 12, it energizes molecules of the donor gases introduced to the vicinity of the substrates through the nozzle 30. This causes the donor gases to form the substance (such as silicon dioxide) to be deposited on the substrates 12. The deposition of the substance on the substrates 12 is facilitated by the formation of the substance in contiguous relationship to the substrates.

The substrates 12 may be moved relative to the light beam 28. For example, the substrates 12 may be moved relative to the light beam 28 in a direction indicated by an arrow 36 (FIG. 2), particularly when the light beam 28 is not as wide as the substrate. This may be accomplished by belts 37 and pulleys 39. As will be seen, this direction is perpendicular to the direction in which the light beam 28 moves along the substrates 12. The substrates 12 may also be rotated relative to the light beam 28 to insure that the substance will be uniformly deposited on the substrate. For example, the substrates 12 may be incrementally rotated through successive angles of approximately 90° or through any other angle. The incremental rotation of the substrates 12 may be accomplished while the light beam 28 is being directed over the substrate or the incremental rotation of the substrates 12 may be provided alternately with the direction of pulsated energy from the light beam 28 toward the substrate. The rotation of the substrates 12 may be provided by any suitable apparatus such as a rack 40 (FIGS. 6 and 7) and pinions 42 on which individual ones of the substrates 12 are mounted.

Instead of moving the substrates 12, the enclosure 18 may be moved. This is indicated by an arrow 43 in FIG. 3. Preferably this movement is transverse to the direction of the light beam 28. However, this movement may occur in the direction of the light beam or opposite the direction of the light beam. Alternatively, the light beam 28 may be reciprocated in the transverse direction to control the deposition of the substance on the substrate. The reciprocation of the light beam 28 may be provided (FIG. 14) by directing the light from the mirror 15a to a mirror 44 substantially parallel to the mirror 15a and by reciprocating the mirror 44 in a direction toward and away from the mirror 15a. This is indicated at 46 in FIG. 14.

As the light beam 28 moves along the substrates 12, it may lose energy. This may result in part when the light beam energizes the molecules of the donor gases to disassociate such molecules for the production of the substance from such disassociated molecules. Compensations may be provided for such loss of energy so that the energy of the light beam at each position in the enclosure 18 is substantially the same. This may be accomplished in different ways. One way is to direct the beam slightly downwardly toward the substrate 12 as shown in FIG. 9 at 48. In this way, any loss of energy in the light beam 28 at progressive positions along the beam in the enclosure 18 is compensated by the reduced distance of the beam from the substrates. This causes the energy needed to deposit the substance on the substrates 12 to become correspondingly reduced.

The loss of energy in the light beam 28 at progressive positions along the substrates 12 may also be compensated by providing a purged reflecting mirror 50 (FIG. 8) at the far end of the enclosure 18. The mirror 50 reflects the light beam 28 so that it moves along the substrates in a direction reverse to that provided by the light source 10. In this way, the average intensity of the light beam 28 at every position in the enclosure 18 along the substrates 12 is substantially the same.

To increase the efficiency in obtaining substrates 12 in which the substance has been deposited on the substrates, pairs of substrates may be disposed in substantially parallel and facing relationship as shown at 52 and 54 in FIG. 12. The substrates 52 may be supported on windows corresponding to the windows 16 and the substrates 54 may be supported as by vacuum from a source 56. However, as will be appreciated, other types of supports such as mechanical supports may be provided for the substrates 54. The distance between the substrates 52 and 54 may be selected so that the light beam 28 passes between the substrates in substantially parallel, but contiguous, relationship to the substrates. The donor gases may then be introduced into the space between the substrates to obtain the formation of the substance when the donor gases are energized by the light beam 28, the substance then being deposited on the substrates 52 and 54.

In addition to increasing the number of substrates in which the substance can be deposited in any time period, the simultaneous deposition of the substance on the substrates 52 and 54 offers other advantages. One advantage is that the provison of pairs of facing substrates 52 and 54 tends to confine the donor gases so that there is an increased tendency for molecules of the donor gases to be dissociated by the energy from the light beam 28. The disposition of the pairs of substrates 52 and 54 in facing relationship is also advantageous because it tends to minimize the amount of the donor gases needed to deposit the substance in a uniform layer of a desired thickness on the substrates. Furthermore, the amount of energy required to obtain the desired deposition of the substance on the substrates is also minimized.

The light beam 28 may be directed into the enclosure 18 through a window 60 (FIGS. 8,10 and 11) in the enclosure. This window may tend to become clouded by any undesired deposition of the substance on the window. When the window 60 becomes clouded, it tends to block the light beam 28 from passing in full strength through the window. To block the substance from becoming deposited on the window 60, a stream of a neutral gas such a nitrogen may be directed past the window. A neutral gas may be defined as one which does not interact with the light beam 28 and does not interfere with the reaction of the gases to form the substance.

The neutral gas may be obtained from a jet 62 (FIG. 10) disposed at one end of the window to direct a stream of the neutral gas in a direction substantially parallel, and contiguous, to the window. A nozzle 64 (FIG. 10) may be provided at the other end of the window to exhaust the neutral gas from the enclosure 18 after the neutral gas has moved past the window. Preferably, the jet 62 is disposed above the window 60 and the nozzle 64 is disposed below the window.

Some of the neutral gas flowing through the nozzle 64 may be allowed to leak into the enclosure 18. This is indicated by an arrow 65 in FIG. 10. As will be appreciated, the neutral gas leaking into the enclosure 18 acts, as a practical matter, to dilute the gases which are dissociated to form the substance deposited on the substrates 12. The dilution of the ionizable gases produces a decrease in the rate at which the substance is deposited on the substrates. By controlling the rate at which the neutral gas is leaked into the enclosure 18, the rate of deposition of the substance on the substrates can be correspondingly controlled.

Alternatively, the neutral gas may be directed through a channel 66 (FIG. 11) which is shaped to receive the neutral gas at one end and to direct the gas in a particular path such as a L-shaped path past the window 60. As will be appreciated, the channel 66 may be discontinuous at positions adjacent the window 60. The channel 66 may be formed between the enclosure 18 and a spacer 68. Alternatively, the neutral gas such as nitrogen may be introduced into the enclosure 18 to become positioned adjacent the window 60.

The deposition of the substance on the substrate 12 may be facilitated by applying heat on a localized basis to the substrates. The heat may be produced by a lamp 70 (FIG. 4) and may be converted into a beam by a reflector 72 such as a parabolic reflector. The reflector 72 directs the heat beam through the windows 16 to the substrates 12 on a localized basis so that the heat is focused on the substrates without being directed to any other member or element in the enclosure 18. By directing the heat beam substantially only to the substrates 12, the deposition of the substance is limited substantially only to the substrates 12 and the deposition of the substance on other members in the enclosure 18 is minimized. The focusing of the heat on each substrate 12 may be enhanced by disposing the window 16 on a bellows 74 which is adjustable in height as by any suitable arrangement 76 such as a ball screw. The construction and operation of the lamp 70, the reflector 72 and the bellows 74 are fully disclosed in my co-pending application Ser. No. 587,284.

Figure 15:
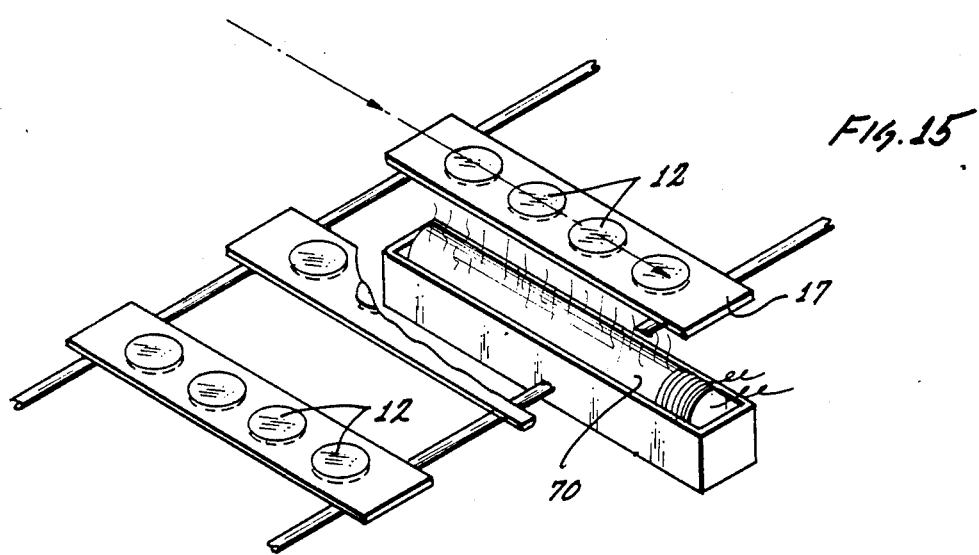
FIG. 15 is a perspective view of another embodiment of the invention.

An alternate embodiment for heating the substrates is shown in FIG. 15. In this alternate embodiment, the heat is not necessarily focused so as to be directed substantially only to the substrates 12. As a result, some of the light 70 may impinge on the support plate 17 even though a reflector such as the reflector 72 may be included. However, since the substrates 10 have a lower mass density than the plate 17 and since the heat is directed to the substrates 12 for only a relatively short period of time such as approximately thirty (30) seconds, the substrates 12 become heated but not the plate 17. This facilitates the deposition of the substance on the substrates 12.

The apparatus and methods described above have certain important advantages. They produce a deposition of the substance such as silicon dioxide on the substrates 12 at relatively high rates such as rates in the order of three thousand angstroms per minute (3000 A/min). Such deposition rates are quite high in relation to the prior art. Such deposition rates are substantially independent of the substrate temperature.

The apparatus and methods described above are also advantageous in that they produce the deposition of the substance on the substrates 12 at relatively low substrate temperatures. Furthermore, the temperature of the substrates 12 can be precisely controlled by the apparatus and methods of this invention. For example, at substrate temperatures below approximately 200° C., the oxide films deposited on the substrates 12 have been found to be milky in appearance and relatively easily scratched. At substrate temperatures above approximately 200° C., the oxide films deposited on the substrate 12 have been found to be substantially transparent and uniform. Furthermore, when the temperature of the substrates 12 is above approximately 250° C., the oxide films deposited on the substrates 12 have been found to be quite scratch-resistant and adherent.

The apparatus and methods of this invention facilitate the deposition of the substance on the substrates 12 at high rates to obtain a high purity, uniformity and stability of the substance on the substrates. For example, the passage of the donor gases close to the surface of the substrates 12 facilitates the deposition of the substance on the substrates at a relatively high rate and with substantially uniform, pure and stable properties. The shaping of the light beam 28 to produce a relatively wide beam in the lateral dimension and a relatively narrow beam in the dimension perpendicular to the substrates 12 also facilitates the deposition of the substance on the substrates at a relatively high rate and with substantially uniform, pure and stable properties. This is also true of the provision of pairs of relatively closely spaced substrates 52 and 54 in facing relationship and the direction of the light beam 28 through the space between the substrates in substantially parallel, and contiguous, relationship to the substrates.

The purge of the window 60 by neutral gases such as nitrogen also facilitates the deposition of the substance on the substrates at high rates and with substantially uniform, pure and stable properties since such a purge provides for the passage of the light beam 28 through the window 60 with minimum attenuation in intensity. The movement of the substrates 12 relative to the light beam, whether in translation or in rotation, facilitates the production of a uniform deposition of the substance on the substrates. Even the compensation in the intensity of the light beam 28 at the different positions on the substrates 12, as shown in FIGS. 8 and 9, ensures that the deposition of the substance on the substrates will be substantially uniform since it provides for the production of substantially the same amount of the substance from the donor gases at the different positions along the substrates.

The formation of the substance such as silicon dioxide may be obtained by subjecting nitrous oxide and silane to the light beam 28 to produce the following chemical reaction:

$$SiH_4 + N_2O \rightarrow SiO_2 + \text{other products} \quad (1)$$

The formation of silicon dioxide by the apparatus and methods of this invention is only illustrative. A number of other substances may also be formed by the apparatus and methods of this invention without departing from the scope of the invention. These include silicon nitride ($Si_3N_4$), alumina ($Al_2O_3$) and zinc oxide (ZnO). These substances may be produced from chemical reactions such as those specified below:

$$SiH_4 + NH_3 \rightarrow Si_3N_4 + \text{other products} \quad (2)$$

$$Al(CH_3)_3 + N_2O \rightarrow Al_2O_3 + \text{other products} \quad (3)$$

$$Zn(CH_3) + NO_2 \rightarrow ZnO + \text{other products} \quad (4)$$

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing for the direction of a substance to a surface of a substrate to affect the surface of the substrate,
    means for holding the substrate in a planar disposition,
    means for directing a beam of substantially coherent light in a first direction substantially parallel to, and contiguous with, the substrate,
    means for introducing to the substrate gases having properties of combining chemically to produce the substance when energized by the beam to provide for a direction of the substance to the substrate, and
    means for reflecting the beam of substantially coherent light after movement of the beam past the substrate to obtain a movement of the beam of substantially coherent light in a second direction substantially parallel to, and contiguous with, the substrate.

2. A combination as set forth in claim 1, including, means for obtaining a movement of the substrate relative to the beam of substantially coherent light in a direction transverse to the direction of the beam 3. A combination as set forth in claim 1, including,
    the moving means providing for a translation of the substrate relative to the beam of substantially coherent light in a direction substantially perpendicular to the beam, and
    means for rotating the substrate relative to the beam of substantially coherent light to facilitate a substantially uniform direction of the substance to the substrate.

4. In combination for providing for the direction of a substance to a substrate to affect the surface of the substrate,
    means for supporting the substrate for disposition in a flat relationship,
    means for directing a beam of substantially coherent light in a first direction substantially parallel, and contiguous, to the substrate,
    means for providing gaseous components having characteristics of reacting to form the substance when subjected to a particular energy level,
    means for introducing the gaseous components to a position contiguous to the substrate at a first end of the substrate for passage along the substrate and for reaction to form the substance in accordance with the direction of the light beam to the substrate, and
    means disposed in contiguous relationship to the substrate at a second end of the substrate opposite the first end for exhausting the gaseous components.

5. A combination as set forth in claim 4, including,
    means for redirecting the beam of light in a second direction substantially parallel, and contiguous, to the substrate after the movement of the light beam past the substrate where the second direction is opposite to the first direction.

6. A combination as set forth in claim 4, including,
    means for shaping the beam of light to be relatively thin in a direction substantially perpendicular to the substrate and to be relatively wide in a direction substantially parallel to the substrate.

7. In combination for providing for a direction of a substance to a pair of substrates disposed in a closely spaced relationship in a first direction and extending in substantially parallel relationship in a second direction substantially perpendicular to the first direction.
    means for passing a substantially coherent beam of light substantially parallel, and contiguous, to the substrates in the second direction and between the substrates in the first direction,
    means for holding the substrates in the substantially parallel, closely spaced relationship, and
    means for introducing, into the space between the substrates in the first direction, gases having properties of combining chemically to produce the substance when energized by the beam of light the introducing means including a first means disposed between the substrates in the first direction at first ends of the substrates for introducing the gases into the space between the substrates in the second direction at positions contiguous to the substrates and further including second means disposed between the substrates in the first direction at second ends of the substrates opposite the first ends for exhausting the gases from the substrates.

8. A combination as set forth in claim 7, including, the beam-passing means being constructed to compensate for any loss of energy in the substantially coherent beam of light during the movement of the substantially coherent beam of light between the substrates in the direction substantially parallel, and contiguous, to the substrates.

9. A combination as set forth in claim 8 wherein
    the beam-passing means directs the beam progressively toward the substrates at a relatively slight angle to the substrates during the passage of the beam along the substrates in the second direction.

10. A combination as set forth in claim 8 wherein
    the beam-passing means includes a reflecting means for redirecting the beam of substantially coherent light between the substrates in a direction substantially parallel to, and contiguous with, the substrates and opposite the first direction and at positions between the substrates in the first direction.

11. In combination for providing for the direction of a substance to a substrate to affect the surface of the substrate,
    means for providing a beam of substantially coherent light,
    means for holding the substrate in a substantially planar relationship,
    means for directing the beam of light in a direction substantially parallel, and contiguous, to the substrate and having relative thin dimensions in a direction substantially perpendicular to the substrate and having relatively wide dimensions in a direction substantially parallel to the substrate,
    means for moving the substrate relative to the beam in a direction to insure that the amount of light directed to the substrate at different positions on the substrate is substantially constant, and
    means for introducing gases to the space contiguous to the substrate, the gases having properties of reacting to produce the substance when energized by the beam of substantially coherent beam of light.

12. In combination for providing for the direction of a substance to a substrate,
    means for providing a beam of substantially coherent light,
    means for holding the substrate in a substantially planar relationship,
    means for directing the beam of light in a direction substantially parallel, and contiguous, to the substrate and having relative thin dimensions in a direction substantially perpendicular to the substrate and having relatively wide dimensions in a direction substantially parallel to the substrate, and means for introducing gases to the space contiguous to the substrate, the gases having properties of reacting to produce the substance when energized by the beam of substantially coherent beam of light, the gas-introducing means including first means disposed in contiguous relationship to the substrate at a first end of the substrate for directing the gases along the substrate in substantially parallel, and contiguous, relationship to the substrate and second means disposed in contiguous relationship to the substrate at a second end of the substrate for exhausting gases from the substrate where the second end of the substrate is opposite the first end of the substrate.

13. In combination for providing for a direction of a substance to a substrate to affect the surface of the substrate, means for introducing to the vinicity of the substrate gases having properties of reacting to form the substrate when subjected to a particular amount of energy, means for holding the substrate in a planar relationship, means for directing a substantially coherent beam of light in a direction substantially parallel, and contiguous, to the substrate with relatively small dimensions in a direction substantially perpendicular to the lateral dimensions, and means for insuring that the amount of light directed by the beam to the different positions on the substrate is substantially constant.

14. In combination for providing for a direction of a substance to a substrate to affect the surface of the substrate, means for introducing to the vicinity of the substrate gases having properties of reacting to form the substrate when subjected to a particular amount of energy, means for holding the substrate in a planar relationship, means for directing a substantially coherent beam of light in a direction substantially parallel, and contiguous, to the substrate with relative small dimensions in a direction substantially perpendicular to the lateral dimensions, and means for compensating, in the deposition of the substance on the substrate, for changes in energy in the beam of substantially coherent light with passage of the light in the direction substantially parallel, but contiguous, to the substrate.

15. A combination as set forth in claim 14, including, the compensating means including means for directing the beam of substantially coherent light in a direction extending toward the substrate at a relatively slight angle to compensate for losses in the energy in the beam substantially coherent light with passage of the beam of substantially coherent light along the substrate.

16. A combination as set forth in claim 14, including, the compensating means including means for reflecting the beam of substantially coherent light, after movement of the beam of substantially coherent light past the substrate, to provide for the passage of the beam of substantially coherent light in a reverse direction substantially parallel, and contiguous, to the substrate.

17. A combination as set forth in claim 14 wherein the beam-directing means includes:

means for providing substantially coherent light, first lens means for widening the dimensions of the substantially coherent light in a lateral direction substantially parallel to the substrate and for converting the widened substantially coherent light into a beam, second means for converting the widened beam of substantially coherent light into a beam having a substantially constant and relatively large dimension in the lateral dimension, third lens means for converging the widened beam of substantially coherent light in a direction substantially perpendicular to the lateral dimension, and fourth lens means for converting the converging beam of substantially coherent light into a beam having a substantially constant and relatively small dimension in the direction substantially perpendicular to the lateral dimension.

18. A combination as set forth in claim 17, means for obtaining a translation of the substrate relative to the substantially coherent beam of light.

19. A combination as set forth in claim 14, including, an enclosure for the substrate, a window disposed in the enclosure for passing the beam of substantially coherent light into the enclosure and along the substrate, and means for inhibiting the deposition of any substance on the window.

20. A combination as set forth in claim 18 wherein the translating means provides for a movement of the substrate relative to the beam in a direction substantially perpendicular to the directions of the beam.

21. A combination as set forth in claim 18 wherein the translating means provides for a rotary movement of the substrate relative to the beam.

22. In combination for providing for a direction of a substance to a substrate to affect the surface of the substrate, an enclosure, means for holding the substrate in the enclosure in a first plane, a window disposed in the enclosure in transverse relationship to the substrate, means for passing a beam of substantially coherent light into the enclosure through the window in a direction substantially parallel, and contiguous, to the substrate, means for introducing gases into the enclosure at a first end of the enclosure at a position contiguous to the substrate and for exhausting gases from the enclosure at a second end of the enclosure opposite the first end and at a position contiguous to the substrate, the gases having properties of combining to form the substance when energized by the beam of substantially coherent light, and means for directing neutral gases past the window to inhibit the deposition of the substance on the window.

23. A combination as set forth in claim 22 wherein the directing means for the neutral gases produce a circulation of the neutral gases in the enclosure past the window.

24. A combination as set forth in claim 22 wherein the directing means directs the neutral gases past the window from one end of the window and exhausts the neutral gases from the other end of the window after movement of the neutral gases past the window.

25. A combination as set forth in claim 23 wherein the neutral gases are leaked into the enclosure on a controlled basis to control the rate of deposition of the substance on the substrate.

26. A combination as set forth in claim 4 wherein means are included for moving the substrate relative to the beam of substantially coherent light.

27. A combination as set forth in claim 26 wherein the beam-moving means includes
a first mirror disposed to receive the beam of light and to reflect such beam and
second means disposed relative to the first mirror to receive the light reflected from the first mirror and movable relative to the first mirror and the substrate to direct the beam of light to progressive positions along the substrate.

28. In combination for providing a direction of a substance to a surface of a substrate to affect the surface of the substrate,
means defining an enclosure,
means for holding the substrate in a planar disposition in the enclosure,
means for introducing gases into the enclosure for disassociation of the gases to form a substance asnd to obtain a direction of the substance to the surface of the substrate,
means for directing a beam of substantially coherent light into the enclosure in a direction substantially parallel, and contiguous, to the enclosure to obtain disassociation of the gases in the enclosure,
a window in the enclosure for passing the beam of substantially coherent light into the enclosure to obtain disassociation of the gases in the enclosure,
means for directing neutral gases past the window to inhibit the deposition of the substance on the window and for leaking the neutral gases into the enclosure to dilute the ionizable gases in the enclosure, and
means for insuring that the amount of light directed by the beam to the different positions on the substrate is substantially constant.

29. In combination for providing for a direction of a substance to a surface of each of a plurality of substrate, to affect the surfaces of the substrates,
means defining an enclosure,
means for holding the substrate in a planar disposition in the enclosure,
means for introducing gases into the enclosure for disassociation of the gases to form a substance and to obtyain a deposition of the substance on the substrate,
means for direction a beam of substantially coherent light into the enclosure in a direction substantially parallel, and contiguous, to the enclosure to obtain a disassociation of the gases in the enclosure,
a window in the enclosure for passing the beam of substantially coherent light into the enclosure to obtain a disassociation of the gases in the enclosure,
means for directing neutral gases past the window to inhibit the deposition of the substance on the window and for leaking the neutral gases into the enclosure to dilute the ionziable gases in the enclosure, and
means for insuring that the strength of the light beam operative upon the gases contiguous to each of the substrates in the plurality is substantially equal.

30. A combination as set forth in claim 28 wherein the beam is shaped to be relatively thin in a direction substantially perpendicular to the substrate.

31. In combination for providing for a direction of a substance to a substrate of a pair of pair of substrates to affect the surfaces of the substrates, the substrates being disposed in substantially parallel and contiguous relationship,
means defining an enclosure,
means for holding the substrate in a planer disposition in the enclosure,
means for introducing gases into the enclosure for disassociation of the gases to form a substance and to obtain a direction of the substance to the surface of the substrate,
means for directing a beam of substantially coherent light into the enclosure in a direction substantially parallel, and contiguous, to the enclosure to obtain a disassociation of the gases in the enclosure,
a window in the enclosure for passing the beam of substantially coherent light into the enclosure to obtain a disassociation of the gases in the enclosure, and
means for directing neutral gases past the window to inhibit the deposition of the substance on the window and for leaking the neutral gases into the enclosure to dilute the ionizable gases in the enclosure,
the light beam being directed between the substrates in substantially parallel, and contiguous, relationship to the substrates.

32. A combination as set forth in claim 4 wherein
the first end of the substrate and the second end of the substrate define a vector corresponding to the first direction light.

33. A combination as set forth in claim 4 wherein the first end of the substrate and the second end of the substrate define a vector transverse to the first direction.

34. In combination for providing for the direction of a substance to a substrate to affect the surface of the substrate,
means for holding the substrate in a planar disposition,
means for directing a beam of a substantially coherent light in a first direction substantially parallel to, and contiguous with, the substrate,
means for introducing to the substrate gases having properties of combining chemically to produce the substance when energized by the beam to provide for a direction of the substance to the substrate, and
means for providing for the movement of the substrate relative to the beam in a direction other than the first direction to insure that the light directed to different positions on the substrate will be substantially constant over the period of time that the beam is directed to the substrate.

35. In a combination as set forth in claim 34,
the moving means providing for a movement of the substrate relative to the beam in a direction transverse to the first direction.

36. In a combination as set forth in claim 34,
the moving means providing for a movement of the substrate relative to the beam in a rotary direction.

37. In a combination as set forth in claim 34,
the beam-directing means being movably by the moving means in a direction transverse to the first direction.

38. In a combination as set forth in claim 34,
the substrate being movable by the moving means in a direction other than the first direction.

* * * * *